United States Patent [19]
Dorey

[11] 3,794,930
[45] Feb. 26, 1974

[54] ELECTRICALLY CONTROLLED SWITCHING CIRCUITS

[75] Inventor: Howard Anthony Dorey, Farnborough, England

[73] Assignee: The Solartron Electronic Group Limited, Farnborough, England

[22] Filed: Mar. 12, 1969

[21] Appl. No.: 806,644

[30] Foreign Application Priority Data

Mar. 15, 1968 Great Britain .................... 12847/68

[52] U.S. Cl. ........................ 330/10, 330/35, 330/98, 330/1
[51] Int. Cl. .............................................. H03f 3/38
[58] Field of Search ................... 330/10, 9; 307/240

[56] References Cited

UNITED STATES PATENTS

| | | | |
|---|---|---|---|
| 2,741,668 | 4/1956 | Iffland | 330/9 |
| 3,518,564 | 6/1970 | Games et al. | 330/10 |
| 2,933,691 | 4/1960 | Stair | 330/10 |
| 3,206,691 | 9/1965 | Martin | 330/9 |
| 3,363,189 | 1/1968 | Oswald | 330/10 X |
| 3,378,779 | 4/1968 | Priddy | 330/10 X |

*Primary Examiner*—Nathan Kaufman
*Attorney, Agent, or Firm*—William R. Sherman, Jerry M. Presson, Roylance, Abrams, Berdo, & Kaul

[57] ABSTRACT

In a chopper stabilized amplifier using FET or other electronic chopper switches, the input chopper switch introduces a frequency dependent error on account of inter-electrode capacitances leading to asymmetrical coupling through the chopper drive waveform. The invention discloses apparatus which modulates the frequency or amplitude of the drive waveform, synchronously demodulates the amplifier output and uses the error signal thus derived to apply corrective feedback at the input to the amplifier.

12 Claims, 6 Drawing Figures

Figure 1:
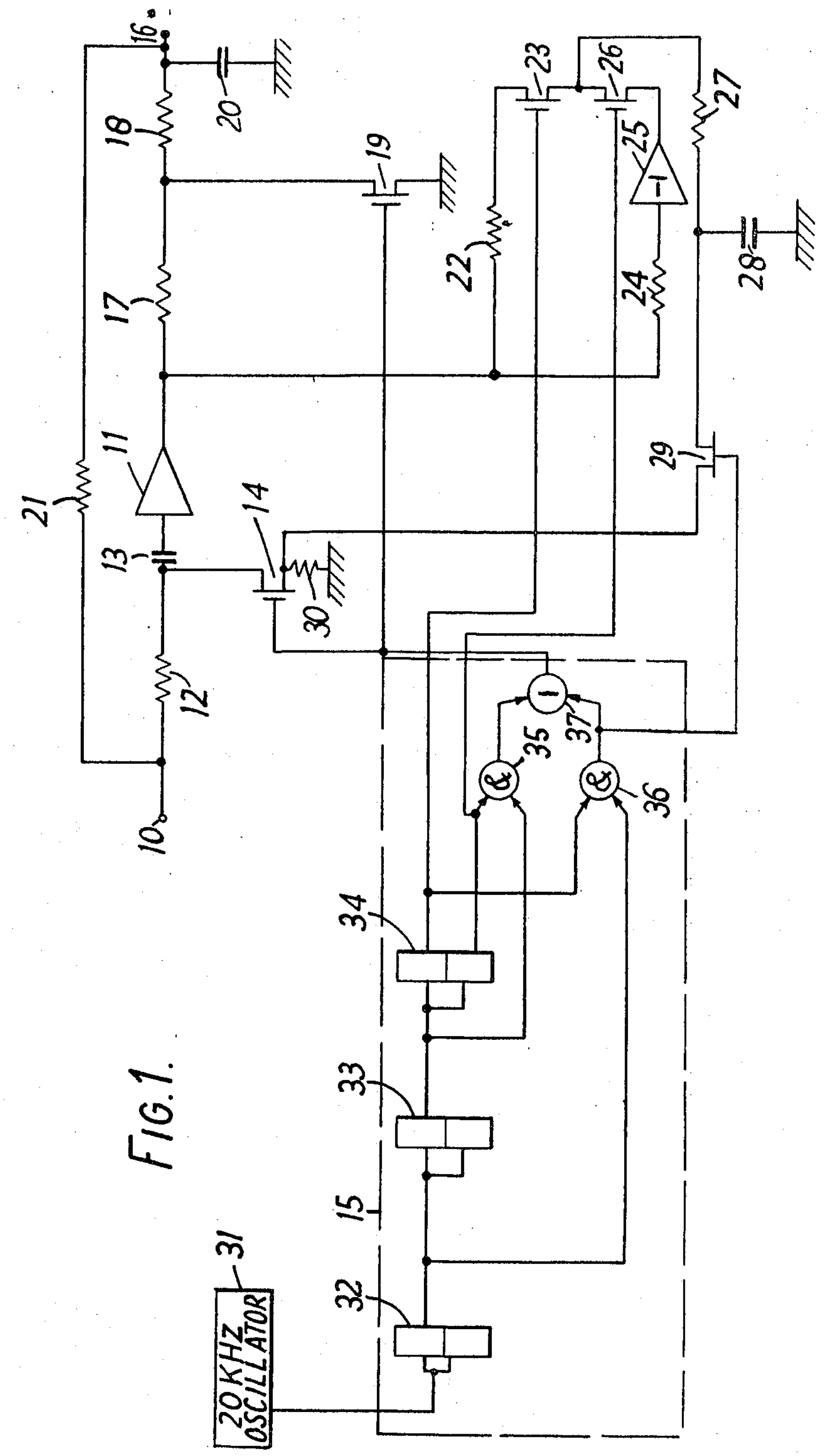

INVENTOR
Howard Anthony Dorey
BY J.M. Presson
ATTORNEY

ELECTRICALLY CONTROLLED SWITCHING CIRCUITS

This invention relates to chopper stabilized amplifiers, that is to say a.c. amplifiers having an input chopper switch for chopping the input to the amplifier and an output chopper switch for synchronously rectifying the output from the amplifier. Mechanical choppers are well known but it is also well known to use purely electronic devices as chopper switches and the present invention is concerned with problems which arise when using such devices.

Accordingly, for the purposes of this specification, a chopper switch is defined as an electrical device having a control terminal and two further terminals the resistance between which assumes relatively high and relatively low values (approximating the open-circuit and short-circuit conditions of a mechanical switch) at two different levels of an electrical switching signal applied to the control terminal.

Examples of a chopper switch so defined are semiconductor devices such as transistors, FET's, photoresistive devices and Hall effect devices.

In a FET for example the gate electrode is the control terminal and the source and drain are the said two further terminals. In a light modulated photo-resistor the signal on the control terminal controls a light source shining on the photo-resistor whose two ends are the said two further terminals and whose "dark" resistance may be about 5 MΩ, dropping to about 1 KΩ when fully illuminated.

For d.c. amplifiers operating at low input signal levels any drift appearing at the output of the amplifier causes a problem since it cannot be distinguished from an actual signal. It appears therefore as if it were due to a variation in the input signal level. This problem of amplifier drift can be solved by utilising the input chopper switch to convert the d.c. signal to an a.c. signal which is amplified in the a.c. amplifier to give an a.c. output proportional to the d.c. signal. The a.c. signal is then applied to a similar chopper switch, namely the output chopper switch, by means of which it is synchronously rectified. The output can be smoothed to provide a d.c. signal which is an amplified version of the original input signal.

Also by the use of the chopper techniques errors due to noise generated within the amplifier may be reduced by switching the chopper at a frequency in a minimum noise band. However little advantage has been taken of this possibility in the prior art because other problems arise when chopping at higher frequencies, as discussed below.

The input chopper switch may be connected across the d.c. source. The switch is switched on and off rapidly and the output consists alternately of the full source voltage whilst the switch is high resistance and no output voltage while the switch is low resistance and effectively short circuits the source. The source is usually connected through a resistor to the switch so that the short circuit current is limited.

Alternatively the chopper switch can be connected in series between the d.c. source and a load. The output to the load then consists alternately of the full source voltage while the switch is low resistance and no output voltage while the switch is high resistance.

Any voltage developed across the switch when it conducts causes an error in the average voltage magnitude applied to any amplifier connected at the chopper output. Such an error voltage is usually present in choppers using transistor switches, because of the collector-emitter voltage drop of a conducting transistor, and is present in a light modulated photo resistor since the "light" resistance, although only 0.02 percent of the dark resistance, is still 1 KΩ.

One known technique for reducing such an "offset voltage" and described in U.S. Pat. No. 3,372,287 is to utilise two transistors with their emitter-collector paths is series back to back, so that the emitter-collector voltage drops substantially cancel. The transistors are switched on and off together by a squarewave applied to their bases.

The development of the MOS Field-Effect Transistor, such as that manufactured and sold by RCA under the type number 3N138, having a substantially zero inherent offset voltage (typically less than 1 $\mu$V) has largely overcome the above disadvantage of the transistor chopper and it is now becoming common to use a single MOS FET as a chopper.

When the problem of offset voltage has been overcome, the biggest remaining problem in high accuracy applications is that of error due to rectification of the drive waveform to the chopper switch. The principal cause of this error in semiconductor devices lies in the stray capacitances which couple the drive signal through the input chopper switch, to be amplified in the a.c. amplifier and transformed into a d.c. or low-frequency error by the demodulator.

Our aforementioned patent specification teaches one method of reducing the effects due to this error by connecting a variable capacitor either alone or with fixed capacitors to form a bridge circuit with the inter-electrode capacitors of the transistor or transistors. The variable capacitor is then adjusted for minimum error, but nevertheless it is difficult to achieve a leakage current below $10^{-11}$ amps.

In the case of semiconductor devices the error signal arises through the inter-electrode impedances which are for all practical purposes capacitances and whose value is therefore practically inversely proportional to frequency. Consider a 5KHz squarewave of 10 volts driving a MOS FET chopper having an inter-electrode capacitance of 1pF, a mean leakage current of $5{,}000 \times 10 \times 10^{-12}$ or $5 \times 10^{-8}$ amps may result. Balancing of stray capacities as described above would reduce this current but since non-linear capacitances are involved it is impossible to reduce the current to zero. It should be noted that the leakage current is proportional to the frequency, in this example 5KHz. In practice, it has accordingly been necessary heretofore to operate with lower frequencies. Many known instruments chop at 100Hz. The Solartron Electronic Group Limited market an instrument which uses a capacitance bridge to balance out the errors and is thus able to operate at 3KHz. These figures are to be contrasted with a desirable figure of 10Khz having regard to the minimum noise band of semiconductor devices.

According to one form of the present invention a chopper stabilized amplifier comprises an a.c. amplifier with input and output chopper switches. A source of a periodic electrical switching signal is provided for operating the chopper switches synchronously. The frequency of the switching signal is modulated in accordance with a predetermined function of time, and a demodulating circuit is arranged to demodulate the output of the a.c. amplifier synchronously with respect to the said function of time to derive an error signal. This error signal is fed back to the input of the amplifier so as to compensate for errors arising from coupling the switching signal into the a.c. amplifier.

According to another form of the invention, the amplitude of the switching signal applied to the input chopper switch is modulated in accordance with the predetermined function of time, and a demodulating circuit is again arranged to demodulate the output of the a.c. amplifier synchronously with respect to said function of time to derive the error signal which is fed back to the input of the amplifier so as to compensate for errors arising from coupling the switching signal into the a.c. amplifier.

The input chopper switch may be any device within the foregoing definition, including the devices specifically described hereinafter and also a transistor device (when a circuit arrangement similar to that shown in the aforementioned patent specification may be used).

Considering the case of frequency modulation, the switching signal may be frequency modulated in various ways and the modulation may be in accordance with any convenient waveform such as a sinewave or squarewave. We prefer, however, to use a squarewave alternately operating at two different frequencies, such as 5KHz and 10KHz for equal intervals of time, such as 200 $\mu$ secs. - that is modulated at a rate of 2.5KHz.

As the impedances of the inter-electrode capacities of a semiconductor device are frequency dependent, any offset current caused thereby will also be frequency dependent. Hence if the switching signal applied to a semiconductor chopper switch is frequency modulated an error signal will be obtained proportional to frequency. In a chopper stabilized amplifier this error signal is amplified by the a.c. amplifier. When an output from the amplifier is demodulated at the modulating frequency a signal is obtained proportional to the error signal and by feeding this back to the input amplifier, the error is reduced.

By way of further explanation, the error signal arises because the areas under the spikes or switching transients, which occur at the instants of switching on and off the chopper switch by virtue of the inter-electrode capacitances, are not the same for the positive transients and the negative transients. Modulation of the frequency of the switching signal varies the mean current corresponding to the difference between the areas, the current varying substantially linearly with frequency. Hence it is possible to obtain a usable error signal for effecting feedback correction.

The alternative way of achieving linear modulation of the current is by amplitude modulation of the switching signal.

It will be shown below that the invention corrects corresponding errors in the case of chopper switches other than semiconductor switches.

Figure 1A:
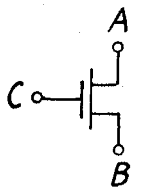
Figure 1B:
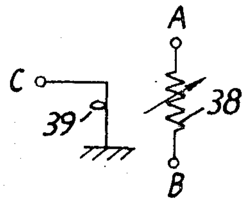
Figure 1C:
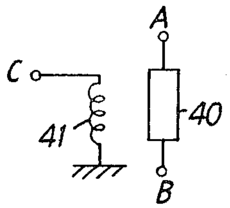
Figure 3:
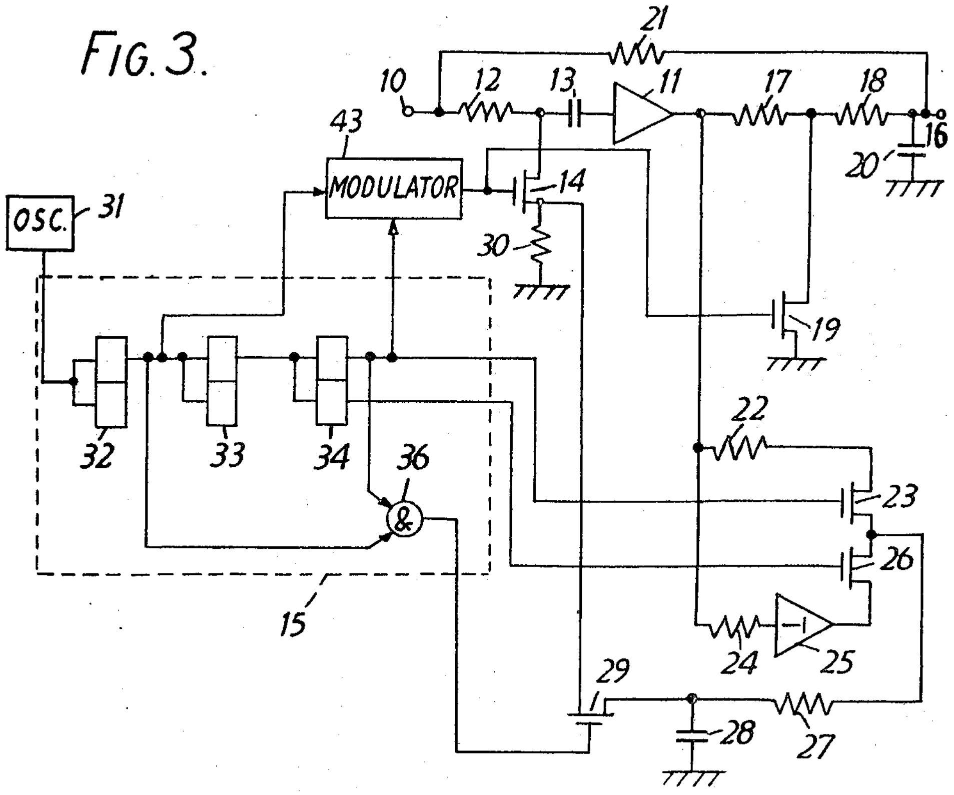

The present invention will now be described in more detail, by way of example, with reference to the accompanying drawings, in which:

FIG. 1 is a circuit diagram of a chopper stabilized amplifier utilizing one embodiment of the invention, FIGS. 1*a* to 1*c* show three chopper switches, FIG. 2*a* to *g* show a series of waveforms which appear at various points in the circuit of FIG. 1, and FIG. 3 shows a second embodiment of the invention.

In FIG. 1 an input terminal 10, to which a d.c. input voltage to be amplified may be applied, is connected to an operational amplifier 11 through a resistor 12 and an a.c. coupling capacitor 13. A MOS FET chopper switch 14 has its drain electrode connected to the junction of the resistor 12 with the capacitor 13, its source electrode connected to signal ground through a resistor 30 and its gate electrode connected to a frequency-modulated drive waveform generator 15 which alternately open circuits and short circuits the drain and source electrodes. The chopper switch 14 serves to chop any input voltage applied to the terminal 10, that is, it applies the input voltage or ground potential in alternate intervals of time to the input of the amplifier 11.

The output of the amplifier 11 is connected to an output terminal 16 through a resistor 17 and a resistor 18 in series. A second MOS FET chopper switch 19, similar to the chopper switch 14 and driven at its gate by the same waveform, has its drain connected to the junction of the resistors 17 and 18 and its source connected to signal ground. The signal appearing at the output of the amplifier 11 is synchronously rectified by the chopper switch 19 and smoothed by a smoothing circuit consisting of the resistor 18 and a capacitor 20.

The resistors 12 and 17 serve merely to limit the short circuit currents through their respective choppers.

Overall negative feedback for the amplifier in this embodiment is provided by a resistor 21 connected between the input and output terminals 10 and 16. Other amplifier configurations are of course possible, e.g. with a feedback capacitor for effecting integration.

Although MOS FET choppers have been shown in FIG. 1, other devices can be used. Thus FIG. 1*a* shows an FET chopper with source and drain terminals labelled A and B and a gate or control terminal labelled C. Two equivalent devices are shown in FIGS. 1*b* and 1*c* with their terminals correspondingly labelled. In FIG. 1*b* a photoresistor 38 is connected between terminals A and B and terminal C is connected to a light source 39 which illuminates the photoresistor 38 in dependence upon the switching signal applied to terminal C. In FIG. 1*c* an anisotropic body 40 exhibiting the Hall effect is connected between the terminals A and B and terminal C is connected to a coil 41 which applies a magnetic field to the body 40.

The circuit so far described but with an unmodulated drive waveform is known. This embodiment of the present invention is based on the realisation that errors due to the inter-electrode capacitances of a semiconductor chopper are linearly frequency dependent. Similarly photoresistors return to their high impedance state with a time constant which is temperature dependent. The switching period is therefore poorly defined and errors introduced are proportional to drive frequency. Again in Hall-effect choppers voltages are induced across the switch as the field is turned on and off and errors are introduced proportional to drive frequency.

Figure 2:
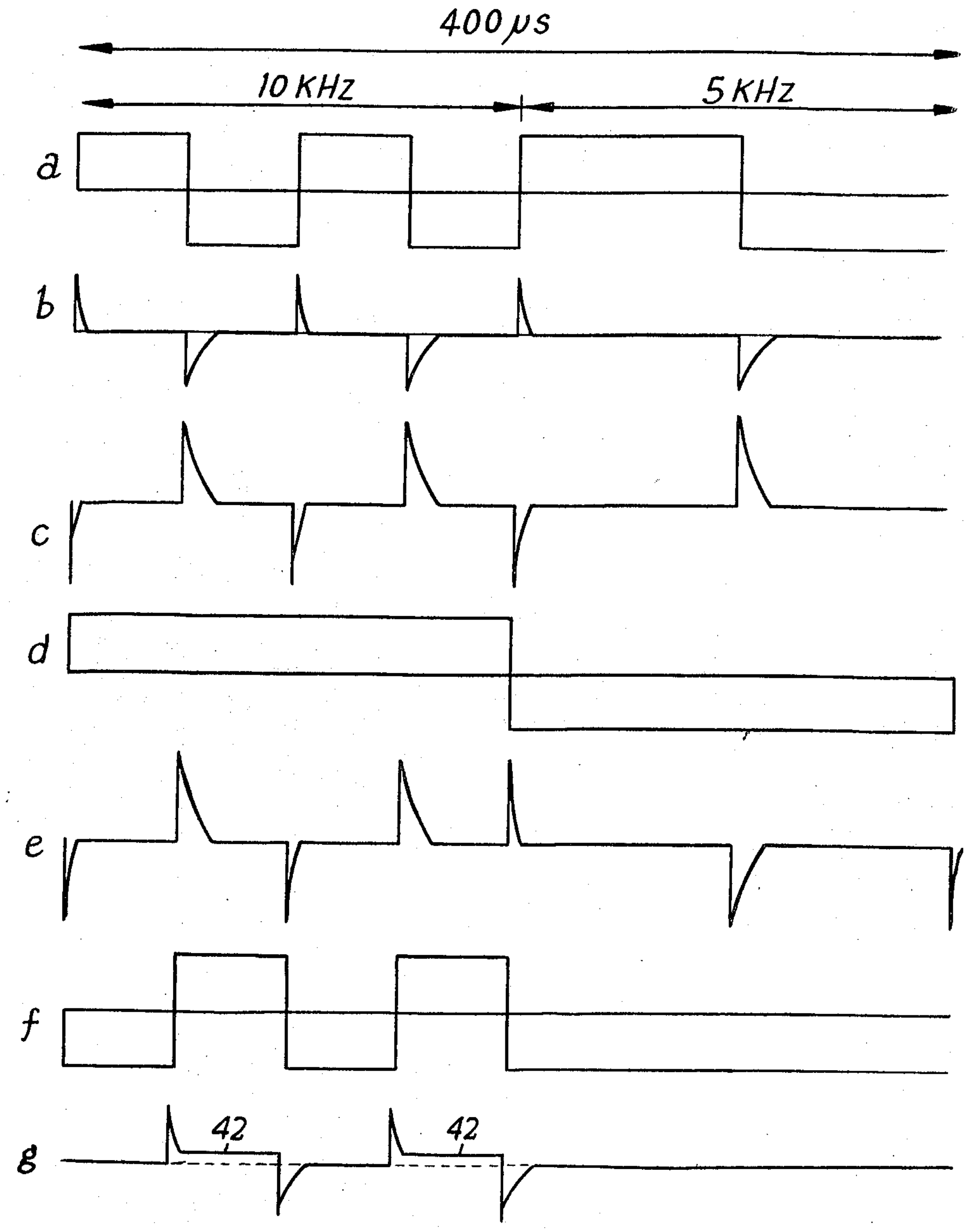

For this reason, the drive waveform to the chopper 14, 19 is varied between two predetermined values at a predetermined rate. A suitable drive signal, shown at FIG. 2*a*, is a square wave operating alternately at 5KHz and 10KHz for 200 $\mu$ secs. time intervals, that is at a rate of 2.5KHz. Considering the FET embodiment for example, and as mentioned previously, the stray capacities associated with the chopper couple part of this drive waveform to the input of the amplifier. FIG. 2*b* shows the kind of waveform which may appear at the input to the amplifier with the terminal 10 grounded. It will be seen that the areas under the spike waveforms are greater for one polarity than the other; in this example the negative-going spikes are greater, although the amplitudes are the same for either polarity. It is this area differential which causes an offset error at the output of the amplifier. FIG. 2*c* shows (to a different scale) the inverted and amplified error waveform which appears at the output of the amplifier 11. This error is frequency dependent and can be utilised to provide an error correcting feedback signal to the amplifier.

The output of the amplifier 11 is also connected through a resistor 22 to the source electrode of an MOS FET switch 23, and through a further resistor 24 and inverting amplifier 25 to the source electrode of an MOS FET switch 26. Anti-phase square-wave drive signals at a frequency of 2.5KHz are provided to the gate electrodes of the switches 23 and 26 respectively. The drain electrodes of the switches 23 and 26 are connected together and to a smoothing network consisting of a resistor 27 and capacitor 28. FIG. 2*d* shows the drive waveform applied to the switch 23. A similar but anti-phase signal is applied to the gate of switch 26.

The effect of including an inverter in the path between the output of the amplifier 11 and the switch 26 is effectively to subtract the error spikes due to the 5KHz drive waveform from those due to the 10KHz drive waveform and FIG. 2*e* shows the waveform appearing at the input to the smoothing network. When this waveform has been smoothed by the circuit 27, 28 it provides a d.c. error signal, which may have a level less than 10$\mu$V. This error signal could be fed back directly to the input terminal 10 of the amplifier 11 to offset the errors due to the waveform of FIG. 2*b*. However, we prefer to feed it back through a further chopper 29 to the source electrode of the chopper 14. In this way a pedestal voltage is intermittently superimposed on the ground level at the source electrode of the chopper 14 to introduce a small current into the amplifier 11 so as to compensate for the error signal. The chopper 29 is driven by either the 10KHz or the 5KHz signal as gated by the 2.5KHz signal. In the example shown the 10KHz signal is used, the input to the gate electrode of the chopper 29 being shown at FIG. 2*f*. FIG. 2*g* shows the resultant signal on the source electrode of the chopper 14. This consists of switched pedestals 42, less than say 10$\mu$V, with associated switching spikes which do not introduce fresh errors however as they feed a low impedance. The resistor 30 is typically 5 Ω to 10Ω .

The advantage of using the chopper 29 in the error-correcting signal feedback loop is that substantially equal and opposite transient switching levels are applied to the input of the amplifier 11. Thus the transient signal on switching is reduced to a minimum, and the amplifier 11 need not be designed to handle such large switching overloads as would be encountered without the chopper 29.

This particular amplifier is designed to operate from an isolated power supply derived from a 20KHz inverter oscillator 31. The chopping frequencies of 10KHz and 5KHz have been selected as being sub-harmonics of this supply frequency, and give minimum error resulting from pick-up of this frequency.

The waveform generator 15 comprises three bistable flip-flop circuits 32, 33 and 34 connected as shown to derive square waves of frequencies 10, 5 and 2.5KHz from the 20KHz supply frequency. 10KHz and 5KHz square waves are applied to AND gates 35 and 36 which are opened alternately for 200 $\mu$ secs. intervals by the 2.5KHz squarewave from the bistable 34. The outputs from the AND gates 35 and 36 are applied to an OR gate 37 at which appears the waveform of FIG. 2*b* which is applied to the choppers 14 and 19.

The two sides of the flip-flop 34 provide the anti-phase 2.5KHz drives to the FET switches 23 and 26 while the output of gate 36 is the waveform of FIG. 2*f* for driving the chopper 29.

The second embodiment of the invention shown in FIG. 3 differs from that shown in FIG. 1 in that amplitude is modulated rather than frequency. This has no sensible effect so far as operation of the chopper switch 14 as an on-off type of device is concerned. However the size of the spikes introduced by the switch 14 is varied and the derivation of the error correcting feedback follows in the same way as before.

The 10KHz output of the flip-flop 32 is now used to drive the chopper switches 14 and 19 but is amplitude modulated at 2.5KHz by the output of the flip-flop 34, utilising a modulator 43, before application to the switch 14. The amplitude modulated switching waveform is preferably applied to the switch 19 also, as shown.

The modulator 43 merely has to vary the amplitude of the chopper pulses between two levels in response to the 2.5KHz waveform and any suitable modulator as used in conventional pulse amplitude modulation techniques will suffice.

I claim:

1. A chopper stabilized amplifier comprising an a.c. amplifier having an input and an output, input and output chopper switches connected respectively to said amplifier input and output, a source of periodic electrical switching signals for operating said chopper switches synchronously, means for modulating the frequency of said switching signals in accordance with a predetermined function of time, demodulating circuit means connected to the output of said amplifier to demodulate a signal derived from the output signal of said a.c. amplifier synchronously with respect to said function of time to derive an error signal, and means for feeding back said error signal to said amplifier input to compensate for errors arising from coupling said switching signal into said a.c. amplifier.

2. A chopper stabilized amplifier according to claim 1, wherein the frequency of said frequency modulated switching signal alternates between two values.

3. A chopper stabilized amplifier according to claim 2, wherein one of said two frequency values is an integral sub-multiple of the other of said two frequency values and said function of time is a squarewave with a frequency which in an integral sub-multiple of both said frequency values.

4. A chopper stabilized amplifier comprising an a.c. amplifier having an input and an output, input and output chopper switches connected respectively to said amplifier input and output, a source of a periodic electrical switching signal for operating said chopper switches synchronously, means for modulating the amplitude of said switching signal as applied to at least said input chopper switch in accordance with a predetermined function of time, demodulating circuit means connected to the output of said amplifier to demodulate a signal derived from the output signal of said a.c. amplifier synchronously with respect to said function of time to derive an error signal, and means for feeding back said error signal to said amplifier input to compensate for errors arising from coupling said switching signal into said a.c. amplifier.

5. A chopper stabilized amplifier according to claim 4, wherein the amplitude of said amplitude modulated switching signal applied to said input chopper switch alternates between two levels.

6. A chopper stabilized amplifier according to claim 4, wherein said amplitude modulated switching signal is applied to both said input and output chopper switches.

7. A chopper stabilized amplifier comprising an a.c. amplifier having an input and an output, input and output chopper switches connected respectively to said amplifier input and output, a source of a periodic electrical switching signal for operating said chopper switches synchronously, means for modulating the amplitude-time area of said switching signal in accordance with a predetermined function of time, demodulating circuit means connected to the output of said amplifier to demodulate a signal derived from the output signal of said a.c. amplifier synchronously with respect to said function of time to derive an error signal, and means for feeding back said error signal to said amplifier input to compensate for errors arising from coupling said switching signal into said a.c. amplifier.

8. A chopper stabilized amplifier according to claim 7, wherein said input chopper switch is connected in series with a resistor across said input of said a.c. amplifier and said error signal is applied to the junction of said resistor and said input chopper switch.

9. A chopper stabilized amplifier according to claim 7, wherein said input chopper switch is a FET.

10. A chopper stabilized amplifier according to claim 7, wherein said input chopper switch comprises a photo-resistor and a light source responsive to said switching signal for illuminating said photo-resistor.

11. A chopper stabilized amplifier according to claim 7, wherein said input chopper switch comprises a body exhibiting the Hall effect and an electromagnet responsive to said switching signal for magnetising said body.

12. A chopper stabilized amplifier according to claim 7, wherein said error signal is applied to a further chopper switch coupled to said amplifier input to introduce a small current into said amplifier.

* * * * *